US011038099B2

(12) United States Patent
Manipatruni et al.

(10) Patent No.: US 11,038,099 B2
(45) Date of Patent: Jun. 15, 2021

(54) PERPENDICULAR MAGNETOELECTRIC SPIN ORBIT LOGIC

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 16/349,575

(22) PCT Filed: Dec. 13, 2016

(86) PCT No.: PCT/US2016/066396
§ 371 (c)(1),
(2) Date: May 13, 2019

(87) PCT Pub. No.: WO2018/111245
PCT Pub. Date: Jun. 21, 2018

(65) Prior Publication Data
US 2020/0211608 A1 Jul. 2, 2020

(51) Int. Cl.
*H01L 43/10* (2006.01)
*G11C 11/16* (2006.01)
*H01L 27/22* (2006.01)
*H01L 43/14* (2006.01)
*H03K 19/18* (2006.01)
*H03K 19/185* (2006.01)

(52) U.S. Cl.
CPC ............ *H01L 43/10* (2013.01); *G11C 11/161* (2013.01); *H01L 27/228* (2013.01); *H01L 43/14* (2013.01); *H03K 19/18* (2013.01); *H03K 19/185* (2013.01)

(58) Field of Classification Search
CPC ... H01L 27/222–228; H01L 43/00–065; H01L 43/10; H01L 43/14
See application file for complete search history.

(56) References Cited

U.S. PATENT DOCUMENTS

| 9,276,040 B1 | 3/2016 | Marshall et al. |
| 10,062,731 B2 | 8/2018 | Manipatruni et al. |
| 2007/0014143 A1 | 1/2007 | Doudin |

(Continued)

FOREIGN PATENT DOCUMENTS

| CN | 108055872 A * | 5/2018 | ......... H01F 10/3286 |
| WO | WO-2014089182 A1 * | 6/2014 | ............. H01L 43/08 |
| WO | 2016105436 | 6/2016 | |

OTHER PUBLICATIONS

Extended European Search Report from European Patent Application No. 16923789.8 dated Apr. 7, 2020, 12 pgs.

(Continued)

*Primary Examiner* — Scott B Geyer
(74) *Attorney, Agent, or Firm* — Green, Howard & Mughal LLP

(57) ABSTRACT

An apparatus is provided which comprises: a first magnet with perpendicular magnetic anisotropy (PMA); a stack of layers, a portion of which is adjacent to the first magnet, wherein the stack of layers is to provide an inverse Rashba-Bychkov effect; a second magnet with PMA; a magneto-electric layer adjacent to the second magnet; and a conductor coupled to at least a portion of the stack of layers and the magnetoelectric layer.

22 Claims, 11 Drawing Sheets

(56) References Cited

U.S. PATENT DOCUMENTS

| | | |
|---|---|---|
| 2009/0067224 A1 | 3/2009 | Hochstrat et al. |
| 2012/0020152 A1* | 1/2012 | Gaudin ............... G11C 11/1675 |
| | | 365/171 |
| 2012/0176154 A1 | 7/2012 | Behin-Aein et al. |
| 2013/0314985 A1 | 11/2013 | Fuhrer et al. |
| 2013/0343118 A1* | 12/2013 | Kim ........................ G11C 11/18 |
| | | 365/158 |
| 2016/0248427 A1 | 8/2016 | Nikonov et al. |
| 2017/0077392 A1* | 3/2017 | Han ........................ G11C 11/18 |

OTHER PUBLICATIONS

Furubayashi, T. et al., "Current-perpendicular-to-plane giant magnetoresistance in spin-valve structures using epitaxial CO2FeAl0.5Si0.5/AG/CO2FeAl0.5SI0.5 trilayers", Applied Physics Letters, vol. 93, No. 12, 2008, 3 pgs.

Manipatruni, Sasikanth et al., "Spin-Orbit Logic with Magnetoelectric Switching: A Multi-Generation Scalable Charge Mediated Nonvolatile Spintronic Logic", Dec. 17, 2015, pp. 1-60.

Wang, Kang L. et al., "Electric-Field Control of Spin-Orbit Interaction for Low-Power Spintronics", Proceedings of the IEEE, Vo. 104, No. 10, Oct. 2016, pp. 1974-2008.

Wang, Mengxing et al., "Tunnel Junction with Perpendicular Magnetic Anisotropy: Status and Challenges", Micromachines, vol. 6, No. 8, Aug. 10, 2015, pp. 1023-1045.

International Search Report and Written Opinion for International Patent Application No. PCT/US16/66396 dated Sep. 8, 2017.

* cited by examiner

PERPENDICULAR MAGNETOELECTRIC SPIN ORBIT LOGIC

CLAIM OF PRIORITY

This Application is a National Stage Entry of, and claims priority to, PCT Application No. PCT/US2016/066396, filed on Dec. 13, 2016 and titled "PERPENDICULAR MAGNETOELECTRIC SPIN ORBIT LOGIC," which is incorporated by reference in its entirety for all purposes.

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (i.e., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 micro-Ampere per bit (µA/bit)) and voltage (e.g., greater than 0.7 volts (V)) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
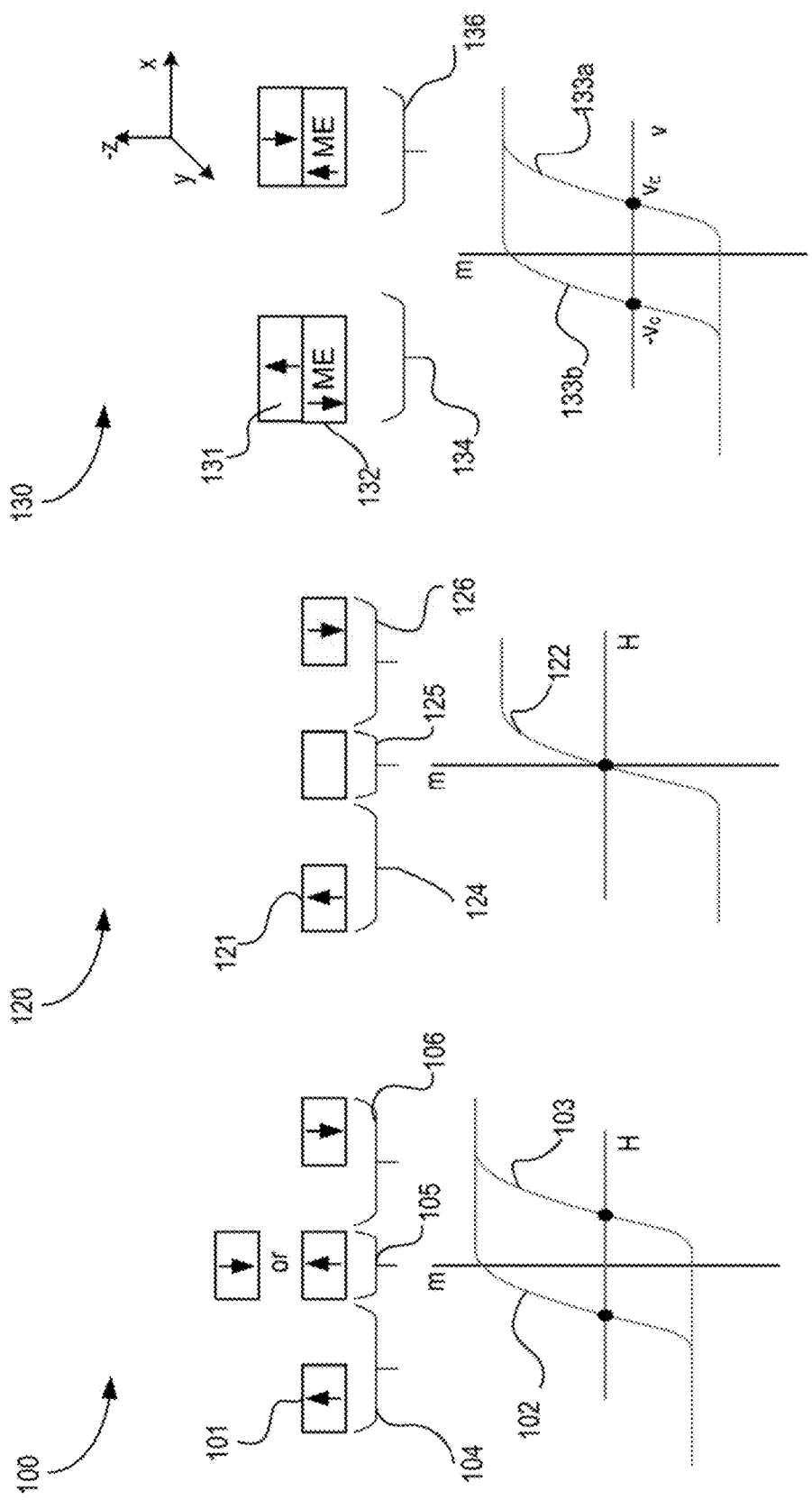
FIG. 1A illustrates magnetization response to applied magnetic field for a ferromagnet.
FIG. 1B illustrates magnetization response to applied magnetic field for a paramagnet.
FIG. 1C illustrates magnetization response to applied voltage field for a paramagnet connected to a magnetoelectric layer.

The Magnetoelectric (ME) effect has the ability to manipulate the magnetization (and the associated spin of electrons in the material) by an applied electric field. Since an estimated energy dissipation per unit area per magnet switching event through the ME effect is an order of magnitude smaller than with spin-transfer torque (STT) effect, ME materials have the capability for next-generation memory and logic applications. Compared to in-plane magnets, perpendicular magnets generally allow for easier lithography constraints on the magnetic dots with reduced aspect ratio requirements for shape. Perpendicular magnets (e.g., with out-of-plane magnetization) exhibit higher retention since the magnetic energy barrier is proportional to anisotropy. Another benefit of perpendicular magnets is that they provide greater choice perpendicular anisotropy and super-lattices.

Various embodiments describe a perpendicular Magnetoelectric Spin Orbit (MESO) Logic which is a combination of four optimum physical phenomena for spin-to-charge and charge-to-spin conversion. In some embodiments, spin-to-charge conversion is achieved via a layer with the inverse Rashba-Bychkov effect (or spin Hall effect) wherein a spin current injected from an input magnet produces a charge current. The sign of the charge current is determined by the direction of the injected spin and thus by the direction of magnetization. In some embodiments, charge-to-spin conversion is achieved via magnetoelectric effect in which the charge current produces a voltage on a capacitor, comprising a layer with magnetoelectric effect, leading to switching magnetization of an output magnet. In some embodiments, magnetic response of a perpendicular magnet is via applied exchange bias from magnetoelectric effect. In some embodiments, a magnetoelectric oxide provides perpendicular exchange bias to the perpendicular magnet due to partially compensated anti-ferromagnetism.

There are many technical effects of various embodiments. For example, high speed operation of the logic (e.g., 100 picoseconds (ps)) is achieved via the use of magnetoelectric switching operating on perpendicular nanomagnets. In some examples, switching energy is reduced (e.g., 1-10 attojoule (aJ)) because the current needs to be "on" for a shorter time (e.g., approximately 3 ps) in order to charge the capacitor. In some examples, in contrast to the spin current, here charge current does not attenuate in the interconnect. Other technical effects will be evident from various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/− 10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates a magnetization hysteresis plot 100 for a perpendicular ferromagnet 101. Plot 100 shows the magnetization response to applied magnetic field for ferromagnet 101. The x-axis of plot 100 is magnetic field 'H' while the y-axis is magnetization 'm'. For ferromagnet (FM) 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturation magnetization configurations 104 and 106, FM 101 has stable magnetizations. In the zero magnetic field region 105 of the hysteresis loop, FM 101 does not have a definite value of magnetizations, but rather depends on the history of applied magnetic fields. For example, the magnetization of perpendicular FM 101 in region 105 can be either in the +y direction or the −y direction. As such, changing the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

FIG. 1B illustrates magnetization plot 120 for paramagnet 121. Plot 120 shows the magnetization response to applied magnetic field for paramagnet 121. A paramagnet as opposed to a ferromagnet exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle curve 122, paramagnet 121 does not have any magnetization because there is no applied magnetic field (e.g., H=0). The intrinsic energy associated with switching is absent in this case.

FIG. 1C illustrates a plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization $P_{FE}$ is in ME layer 132 and is indicated by the arrow in the ME layer 132. In this example, magnetization is driven by exchange bias exerted by a ME effect from ME layer 132. When positive voltage is applied to ME layer 132, paramagnet 131 establishes a deterministic magnetization (e.g., in the +y direction by voltage $+V_c$) as shown by configuration 136. When negative voltage is applied to ME layer 132, paramagnet 131 establishes a deterministic magnetization (e.g., in the −y direction by voltage $-V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. The hysteresis behavior of FM 131, as shown in FIG. 1C, is associated with the driving force of switching rather than the intrinsic resistance of the magnet to switching.

Figure 2:
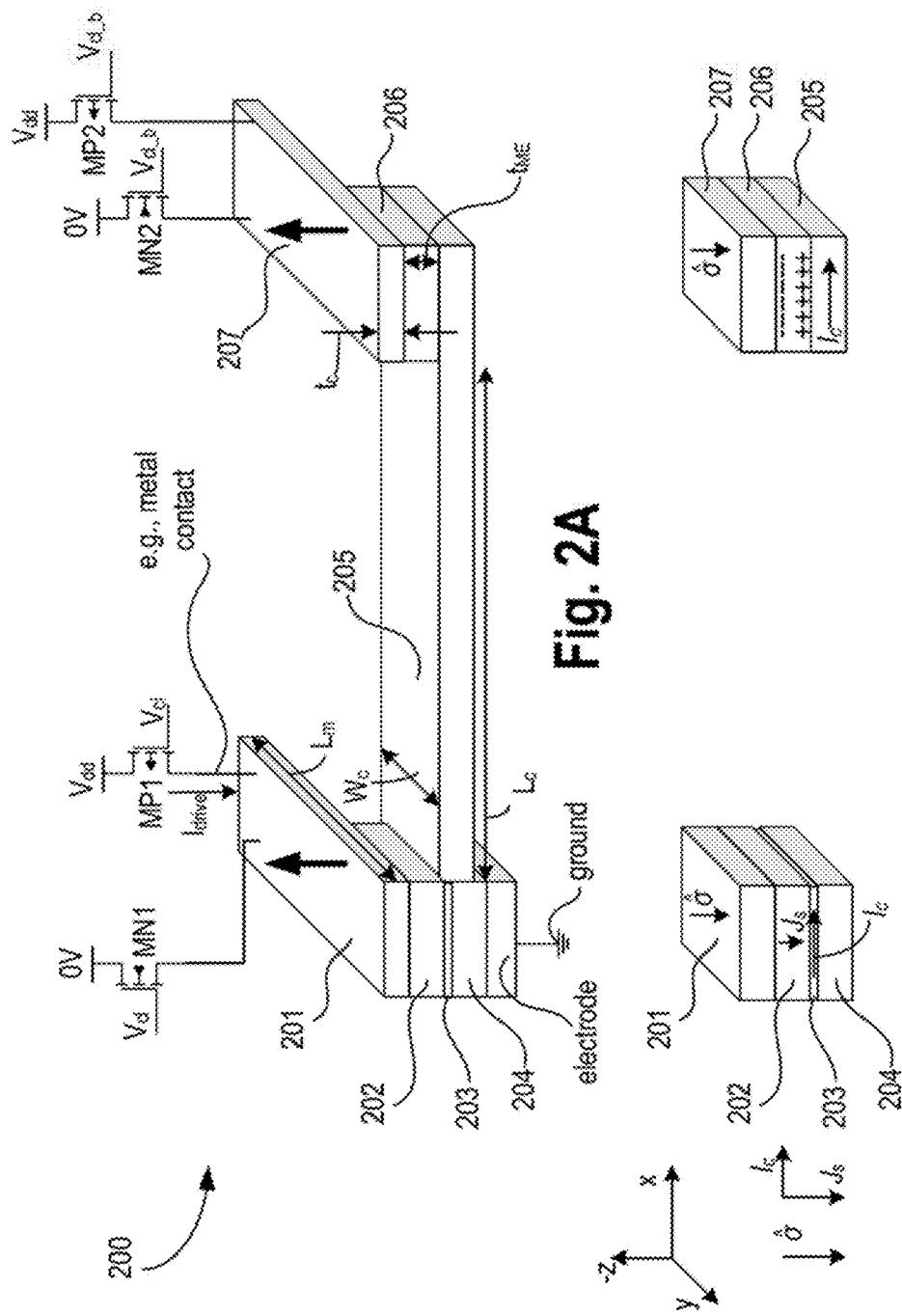
FIG. 2A illustrates a perpendicular magnetoelectric spin orbit logic (SOL), according to some embodiments of the disclosure.
FIG. 2B illustrates a spin orbit material stack of an interconnect, according to some embodiments of the disclosure.
FIG. 2C illustrates a material stack at the output of an interconnect, according to some embodiments of the disclosure.

FIG. 2A illustrates a perpendicular magnetoelectric spin orbit logic (SOL) 200, according to some embodiments of the disclosure. FIG. 2B illustrates a material stack at the input from an interconnect, according to some embodiments of the disclosure. FIG. 2C illustrates a perpendicular magnetoelectric material stack at the output to an interconnect, according to some embodiments of the disclosure. It is pointed out that those elements of FIGS. 2A-C having the same reference numbers (or names) as the elements of any other figure can operate or function in any manner similar to that described, but are not limited to such.

In some embodiments, SOL 200 comprises a first magnet 201 with perpendicular magnetic anisotropy (PMA), a stack of layers (e.g., layers 202, 203, and 204) adjacent to first magnet 201, interconnecting conductor 205 (e.g., a non-magnetic charge conductor), magnetoelectric (ME) layer 206, and second magnet 207 with PMA. In some embodiments, ME layer 206 is adjacent to second magnet 207. In some embodiments, conductor 205 is coupled to at least a portion of the stack of layers (201, 202, 203, 204) and ME layer 206. For example, conductor 205 is coupled to layer 204 of the stack. In some embodiments, a contact (not shown) is provided on top of first magnet 201, where the contact is used to connect to a transistor or any source that provides charge current. In some embodiments, the contact is formed of non-magnetic metal (e.g., Cu, Ag, etc.). In some embodiments, a non-magnetic metal layer (e.g., Cu, Ag, etc.) is sandwiched between first magnet 201 and the stack of layers.

In some embodiments, the stack of layers is to provide an inverse Rashba-Bychkov effect (or inverse spin Hall effect). In some embodiments, the stack of layers provide spin-to-charge conversion where a spin current $J_s$ or $I_s$ is injected from first magnet 201 (also referred to as the input magnet) and charge current $I_c$ is generated by the stack of layers. This charge current $I_c$ is provided to conductor 205 (e.g., charge interconnect). In contrast to spin current, charge current does not attenuate in conductor 205. The direction of the charge current $I_c$ depends on the direction of magnetization of first magnet 201. In some embodiments, the charge current $I_c$ charges the capacitor around ME layer 206 and switches its polarization. ME layer 206 exerts exchange bias on second magnet layer 207, and the direction of the exchange bias determines the magnetization of second magnet 207.

In this example, the length of first magnet is $L_m$, the width of conductor 205 is $W_c$, and the length of conductor 205 from the interface of layer 204 to ME layer 206 is $L_c$. In some embodiments, conductor 205 is formed of a material selected from a group consisting of: Cu, Ag, Al, and Au. In some embodiments, a transistor (e.g., p-type transistor MP1) is coupled to first magnet 201. In this example, the source terminal of MP1 is coupled to a supply $V_{dd}$, the gate terminal of MP1 is coupled to a control voltage $V_{cl}$ (e.g., a switching clock signal that switches between $V_{dd}$ and ground levels), and the drain terminal of MP1 is coupled to first magnet 201. The current $I_{drive}$ from transistor MP1 causes first magnet 201 to generate spin current the stack of layers (e.g., layers 202, 203, and 204).

In some embodiments, along with the p-type transistor MP1 connected to $V_{dd}$ (or an n-type transistor connected to $V_{dd}$ but with gate overdrive above $V_{dd}$), an n-type transistor MN1 is provided which couples to magnet 201, where the n-type transistor is operable to couple ground (or 0V) to magnet 201. In some embodiments, n-type transistor MN2 is provided which is operable to couple ground (or 0V) to magnet 207. In some embodiments, p-type transistor MP2 is provided which is operable to couple power supply ($V_{dd}$ or $-V_{dd}$) to magnet 207. For example, when clock is low (e.g., $V_{cl}$=0V), then transistor MP1 is on and $V_{dd}$ is coupled to input magnet 201 (e.g., power supply is $V_{dd}$) and 0V is coupled to output magnet 207. This provides a path for charge current to flow. Continuing with this example, when clock is high (e.g., $V_{cl}$=$V_{dd}$ and power supply is $V_{dd}$), then transistor MP1 is off, transistor MN1 is on, and transistor MN2 is off. As such, 0V is coupled to input magnet 201. In some embodiments, the power supply is a negative power supply (e.g., $-V_{dd}$). In that case, then transistor MP1's source is connected to 0V, and transistor MN1's source is connected to $-V_{dd}$, and transistor MN2 is on. When $V_{cl}$=0V and power supply is $-V_{dd}$, then transistor MN1 is on, and transistor MP1 is off, and transistor MN2 (whose source is at $-V_{dd}$) is off and MP2 whose source is 0V is on. In this case, $-V_{dd}$ is coupled to input magnet 201 and 0V is coupled to output magnet 207. This also provides a path for charge current to flow. Continuing with this example, when clock is high (e.g., $V_{cl}$=$-V_{dd}$ and power supply is $-V_{dd}$), then transistor MP1 is off, transistor MN1 is on, and transistor MN2 is off. As such, 0V is coupled to input magnet 201.

In some embodiments, ME layer 206 forms a magnetoelectric capacitor to switch PMA FM magnets. For example, the conductor 205 forms one plate of the capacitor, PMA FM magnet 207 forms the other plate of the capacitor, and layer 206 is the magnetic-electric oxide that provides out-of-plane exchange bias to PMA FM magnet 207. In some embodiments, the magnetoelectric oxide comprises perpendicular exchange bias due to partially compensated anti-ferromagnetism.

The first magnet 201 injects a spin polarized current into the high spin-orbit coupling (SOC) material stack (e.g., layers 202, 203, and 204). The spin polarization is determined by the magnetization of first magnet 201. In some embodiments, the injection stack comprises i) an interface 203 with a high density 2D (two dimensional) electron gas and with high SOC formed between materials 202 and 204 such as Ag or Bi, or ii) a bulk material 204 with high Spin Hall Effect (SHE) coefficient such as Ta, W, or Pt. In some embodiments, a spacer (or template layer) is formed between first magnet 201 and the injection stack. In some embodiments, this spacer is a templating metal layer which provides a template for forming first magnet 201. In some embodiments, the metal of the spacer which is directly coupled to first magnet 201 is a noble metal (e.g., Ag, Cu, or Au) doped with other elements from Group 4d and/or 5d of the Periodic Table. In some embodiments, first magnet 201 are sufficiently lattice matched to Ag (e.g., a material which is engineered to have a lattice constant close (e.g., within 3%) to that of Ag).

Here, sufficiently matched atomistic crystalline layers refer to matching of the lattice constant 'a' within a threshold level above which atoms exhibit dislocation which is harmful to the device (for instance, the number and character of dislocations lead to a significant (e.g., greater than 10%) probability of spin flip while an electron traverses the interface layer). For example, the threshold level is within 5% (i.e., threshold levels in the range of 0% to 5% of the relative difference of the lattice constants). As the matching improves (i.e., matching gets closer to perfect matching), spin injection efficiency from spin transfer from first magnet 201 to first ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

Transduction mechanisms for Spin to Charge and Charge to Spin Conversion

| | Spin → Charge | Charge → Spin |
|---|---|---|
| Bulk | Inverse Spin Hall Effect | Magnetoelectric effect |
| Interface | Inverse Rashba-Bychkov Effect | Magnetoelectric effect |

In some embodiments, the spin-orbit mechanism responsible for spin-to-charge current conversion is described by the inverse Rashba-Bychkov effect in a 2D electron gases. Positive currents along the +y axis produce a spin injection current with transport direction along the +z direction and spins pointing to the +z direction.

$$J_s = \theta_{xyz} \cdot J_y \cdot \sigma_z$$

The Hamiltonian (energy) of spin-orbit coupling electrons in a 2D electron gas is:

$$H_R = \alpha_R (k \times \hat{x}) \cdot \vec{\sigma}$$

where $\alpha_R$ is the Rashba coefficient, 'k' is the operator of momentum of electrons, $\hat{x}$ is a unit vector along the gradient of the potential at the surface, $\vec{\sigma}$ is the operator of spin of electrons. This results in the generation of a charge current $I_c$ in interconnect 205 proportional to the spin current $I_x$ (or $J_x$). The spin-orbit interaction by Ag and Bi interface layers (e.g., the Inverse Rashba-Bychkov Effect (IRBE)) produces a charge current $I_c$ in the horizontal direction given as:

$$I_c = \frac{\lambda_{IRBE} I_s}{w_m}$$

where $w_m$ is width of the input magnet 201, and $\lambda_{IRYE}$ is the IRYE constant (with units of length) proportional to $\alpha_R$.

IRBE effect produces spin-to-charge current conversion around 0.1 with existing materials at 10 nm (nanometers) magnet width. The net conversion of the drive charge current $I_{drive}$ to magnetization dependent charge current is given as:

$$I_c = \pm \frac{\lambda_{IRBE} P I_d}{w_m}$$

where 'P' is the dimensionless spin polarization. For this estimate, the drive current $I_{drive}$ ($I_d$) and the P signal charge current $I_c = I_d = 100$ μA is set. Estimating the resistance of the ISHE interface to be equal to R=100Ω, then the induced voltage is equal to $V_{ISHE} = 10$ mV.

The charge current $I_c$, carried by interconnect 205, produces a voltage on the capacitor of ME layer 206 comprising magnetoelectric material dielectric (such as BiFeO$_3$ (BFO) or Cr$_2$O$_3$) in contact with second magnet 207 (which serves as one of the plates of the capacitor). In some embodiments, magnetoelectric materials are either intrinsic multiferroics or composite multiferroic structures. As the charge accumulates on the magnetoelectric capacitor of ME layer 206, a strong magnetoelectric interaction causes the switching of magnetization in second magnet 207. For the following parameters of the magnetoelectric capacitor: thickness $t_{ME}=5$ nm, dielectric constant ε=500, area A=60 nm×20 nm. Then the capacitance is given as:

$$C = \frac{\varepsilon \varepsilon_0 A}{t_{ME}} \approx 1 fF$$

Demonstrated values of the magnetoelectric coefficient is $\alpha_{ME} \sim 10/c$, where the speed of light is c. This translates to the effective magnetic field exerted on the nanomagnets, which is expressed as:

$$BME = \alpha_{ME} E = \frac{\alpha_{ME} V_{ISHE}}{t_{ME}} \sim 0.06 T$$

This is a strong field sufficient to switch magnetization.

The charge on the capacitor of ME layer 206 is $$Q = \frac{1}{fF} \times 10 \text{ mV} = 10 \text{ aC},$$

and the time to fully charge it to the induced voltage is the induced voltage is td=10 Q/$I_d \sim 1$ ps (with the account of decreased voltage difference as the capacitor charges). If the driving voltage is $V_d=100$ mV, then the energy $E_{sw}$ to switch is expressed as:

$$E_{sw} \sim 100 \text{ mV} \times 100 \text{ μA} \times 1 \text{ ps} \sim 10 \text{ aJ}$$

which is comparable to the switching energy of CMOS transistors. Note that the time to switch $t_{sw}$ magnetization remains much longer than the charging time and is determined by the magnetization precession rate. The micromagnetic simulations predict this time to be $t_{sw} \sim 100$ ps, for example. In some embodiments, a non-magnetic electrode (e.g., Cu) is formed and coupled to layer 204 to provide a connection to a supply (e.g., ground or Vdd). In some embodiments, the sideways section of conducting interconnect 205 is aligned with the interface between layer 202 and 204 to capture sideways IRBE current.

In some embodiments, materials for first and second magnets 201 and 207 have saturated magnetization $M_s$ and effecting anisotropy field $H_k$. Saturated magnetization $M_s$ is generally the state reached when an increase in applied external magnetic field H cannot increase the magnetization of the material (i.e., total magnetic flux density B substantially levels off). Anisotropy $H_k$ generally refers to the material property which is directionally dependent. Materials with $H_k$ are materials with material properties that are highly directionally dependent. In some embodiments, a top contact is attached to magnet 201.

In some embodiments, materials for first and second magnets are paramagnets 201 and 207. Paramagnets are non-ferromagnetic elements with strong paramagnetism materials which have high number of unpaired spins but are not room temperature ferromagnets.

In some embodiments, first and second paramagnets 201 and 207 comprise a material selected from a group consisting of: Platinum (Pt), Palladium (Pd), Tungsten (W), Cerium (Ce), Aluminum (Al), Lithium (Li), Magnesium (Mg), Sodium (Na), Cr$_2$O$_3$ (chromium oxide), CoO (cobalt oxide), Dysprosium (Dy), Dy$_2$O (dysprosium oxide), Erbium (Er), Er$_2$O$_3$ (Erbium oxide), Europium (Eu), Eu$_2$O$_3$ (Europium oxide), Gadolinium (Gd), Gadolinium oxide (Gd$_2$O$_3$), FeO and Fe$_2$O$_3$ (Iron oxide), Neodymium (Nd), Nd$_2$O$_3$ (Neodymium oxide), KO$_2$ (potassium superoxide), praseodymium (Pr), Samarium (Sm), Sm$_2$O$_3$ (samarium oxide), Terbium (Tb), Tb$_2$O$_3$ (Terbium oxide), Thulium (Tm), Tm$_2$O$_3$ (Thulium oxide), and V$_2$O$_3$ (Vanadium oxide).

In some embodiments, the first and second paramagnets 201 and 207 comprise dopands selected from a group consisting of: Ce, Cr, Mn, Nb, Mo, Tc, Re, Nd, Gd, Tb, Dy, Ho, Er, Tm, and Yb. The relaxation time of a paramagnet is enhanced (e.g., made shorter) by doping with materials with stronger dissipation elements to promote Spin-lattice relaxation time ($T_1$) and Spin-spin relaxation time ($T_2$). Here, the term "Spin-lattice relaxation time ($T_1$)" generally refers to the mechanism by which the component of the magnetization vector along the direction of the static magnetic field reaches thermodynamic equilibrium with its surroundings. Here, the term "Spin-spin relaxation time ($T_2$)" generally refers to a spin-spin relaxation is the mechanism by which, the transverse component of the magnetization vector, exponentially decays towards its equilibrium value.

In some embodiments, first and second magnets 201 and 207 are free ferromagnets that are made from CFGG (i.e., Cobalt (Co), Iron (Fe), Germanium (Ge), or Gallium (Ga) or a combination of them). In some embodiments, first and second magnets 201 and 207 are free magnets that are formed from Heusler alloy(s). Heusler alloy is ferromagnetic metal alloy based on a Heusler phase. Heusler phase is intermetallic with certain composition and face-centered cubic (FCC) crystal structure. The ferromagnetic property of the Heusler alloy is a result of a double-exchange mechanism between neighboring magnetic ions.

In some embodiments, first and second magnets 201 and 207 are Heusler alloy lattices matched to Ag (i.e., the Heusler alloy is engineered to have a lattice constant close (e.g., within 3%) to that of Ag or to a rotated lattice). In some embodiments, the direction of the spin polarization is determined by the magnetization direction of first magnet 201. In some embodiments, the magnetization direction of second magnet 207 depends on the direction of the strain provided by ME layer 206, which in turn depends on the direction of an input charge current $I_{charge}$ (IN).

In some embodiments, first and second magnets 201 and 207 are formed of Heusler alloy, Co, Fe, Ni, Gd, B, Ge, Ga, or a combination of them. In some embodiments, Heusler alloys that form first and second magnets 201 and 207 are one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, the thickness $t_c$ of first and second magnets 201 and 207 may determine its magnetization direction. For example, when the thickness of a ferromagnetic layer is above a certain threshold (depending on the material of the magnet, e.g., approximately 1.5 nm for CoFe), then the ferromagnetic layer exhibits magnetization direction which is in-plane. Likewise, when the thickness of the ferromagnetic layer is below a certain threshold (depending on the material of the magnet), then the ferromagnetic layer exhibits magnetization direction which is perpendicular to the plane of the magnetic layer. Other factors may also determine the direction of magnetization. Here, first and second magnets 201 and 207 have out-of-plane magnetization (e.g., pointing in the +/− z-direction).

For example, factors such as surface anisotropy (depending on the adjacent layers or a multi-layer composition of the ferromagnetic layer) and/or crystalline anisotropy (depending on stress and the crystal lattice structure modification such as FCC (face centered cubic) lattice, BCC (body centered cubic) lattice, or $L1_0$-type of crystals, where $L1_0$ is a type of crystal class which exhibits perpendicular magnetizations), can also determine the direction of magnetization.

In some embodiments, first and second magnets 201 and 207 are magnetized perpendicular to the plane of the chip having apparatus 200. In some embodiments, first and second magnets 201 and 207 with PMA are formed with multiple layers in a stack. The multiple thin layers can be layers of Cobalt and Platinum (i.e., Co/Pt), for example. Other examples of the multiple thin layers include: Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, MgO; $Mn_xGa_y$; Materials with $L1_0$ crystal symmetry; or materials with tetragonal crystal structure. In some embodiments, the perpendicular magnetic layer is formed of a single layer of one or more materials. In some embodiments, the single layer is formed of MnGa. In some embodiments, the perpendicular magnetic layer is formed of one of: a Heusler alloy, Co, Fe, Ni, Gd, B, Ge, Ga, permalloy, YIG (Yttrium iron garnet), or a combination of them.

In some embodiments, the stack of layers comprises a first layer 202 comprising Ag, wherein first layer 202 is adjacent to first magnet 201; and a second layer 204 comprising a material or a hetero-structure which provided Rashba-Bychkov effect, wherein second layer 204 is adjacent to first layer 202 and to conductor 205. In some embodiments, layers 203 and 204 comprise two-dimensional materials (2D) with spin orbit interaction. In some embodiments, the 2D materials are selected from a group consisting of: Graphene, $MoS_2$, $WSe_2$, $WS_2$, and $MoSe_2$. In some embodiments, the 2D materials include an absorbent selected from a group consisting of: Cu, Ag, Pt, Bi, Fr, and H absorbents.

In some embodiments, a third layer 203 is sandwiched between first layer 202 and second layer 204 as shown. The third layer 203 may be formed of special materials with the Rashba-Bychokov effect. In some embodiments, layer 203 comprises materials $ROCh_2$, where 'R' is selected from a group consisting of: La, Ce, Pr, Nd, Sr, Sc, Ga, Al, and In, and where "Ch" is a chalcogenide selected from a group consisting of S, Se, and Te. In some embodiments, layer 202 and 204 are layers that form hetero-structure with Cu, Ag, Al, and Au. In some embodiments, the stack of layers comprises a material selected from a group consisting of: β-Ta, β-W, W, Pt, Cu doped with Iridium, Cu doped with Bismuth, and Cu doped an element of 3d, 4d, 5d, 4f, or 5f of periodic table groups.

In some embodiments, ME layer 206 is formed of a material selected from a group consisting of: $Cr_2O_3$ and multiferroic material. In some embodiments, ME layer 206 comprises Cr and O. In some embodiments, the multiferroic material comprises $BiFeO_3$. In some embodiments, ME layer 206 comprises magnetoelectric perovskites having output out-of-plane remnant magnetization. In some embodiments, the magnetoelectric perovskites comprise a material selected from a group consisting of: BFO, La—BFO, and Ce—BFO. In some embodiments, ME layer 206 comprises magnetoelectric oxides having out-of-plane magnetism without ferroelectricity. In some embodiments, the magnetoelectric layer comprises a material selected from a group consisting of: $Cr_2O_3$ and B—$Cr_2O_3$.

Figure 3:
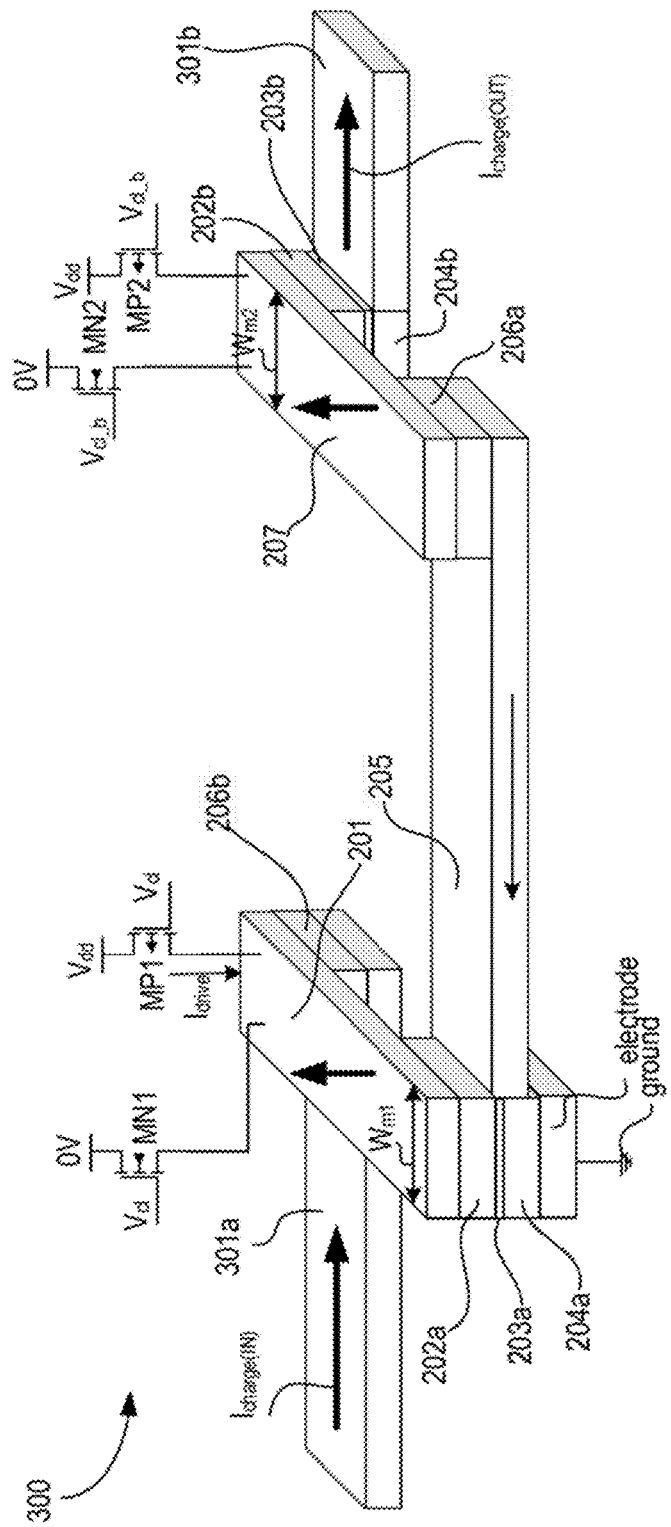
FIG. 3 illustrates a perpendicular magnetoelectric SOL, according to some embodiments of the disclosure.

FIG. 3 illustrates paramagnetic SOL 300, according to some embodiments of the disclosure. It is pointed out that those elements of FIG. 3 having the same reference numbers (or names) as the elements of any other figure can operate or function in any manner similar to that described, but are not limited to such. SOL 300 is similar to SOL 200 except for the fact the input and output charge conductors 301a and 301b have been added, with associated charge-to-spin and spin-to-charge converters, respectively. In some embodiments, input charge current $I_{charge(IN)}$ is provided on interconnect 301a (e.g., charge interconnect made of same material as interconnect 205). In some embodiments, interconnect 301a is coupled to first magnet 201 via ME layer 206b (note ME layer 206 is now labeled as ME Layer 206a). In some embodiments, interconnect 301a is orthogonal to first magnet 201. For example, interconnect 301a extends in the x-direction while first paramagnet 201 extends in the y-direction. In some embodiments, $I_{charge(IN)}$ is converted to corresponding magnetic polarization of 201 by ME layer 206b. The materials for ME layer 206a and ME layer 206b are the same as ME layer 206.

In some embodiments, an output interconnect 301b is provided to transfer output charge current $I_{charge(OUT)}$ to another logic or stage. In some embodiments, output interconnect 301b is coupled to second magnet 207 via a stack of layers that exhibit inverse spin Hall effect (i.e., inverse Rashba-Bychkov effect). For example, layers 202b, 203b, and 204b are provided as a stack to couple output interconnect 301b with second magnet 207. Note layers 202, 203, and 204 are now labeled as layers 202a, 203a, and 204a, respectively. Material wise, layers 202b, 203b, and 204b are formed of the same material as layers 202a, 203a, and 204a, respectively. While the various embodiments are described with reference to a paramagnet, they can also be applicable to free ferromagnets, in accordance with some embodiments of the disclosure.

Figure 4:
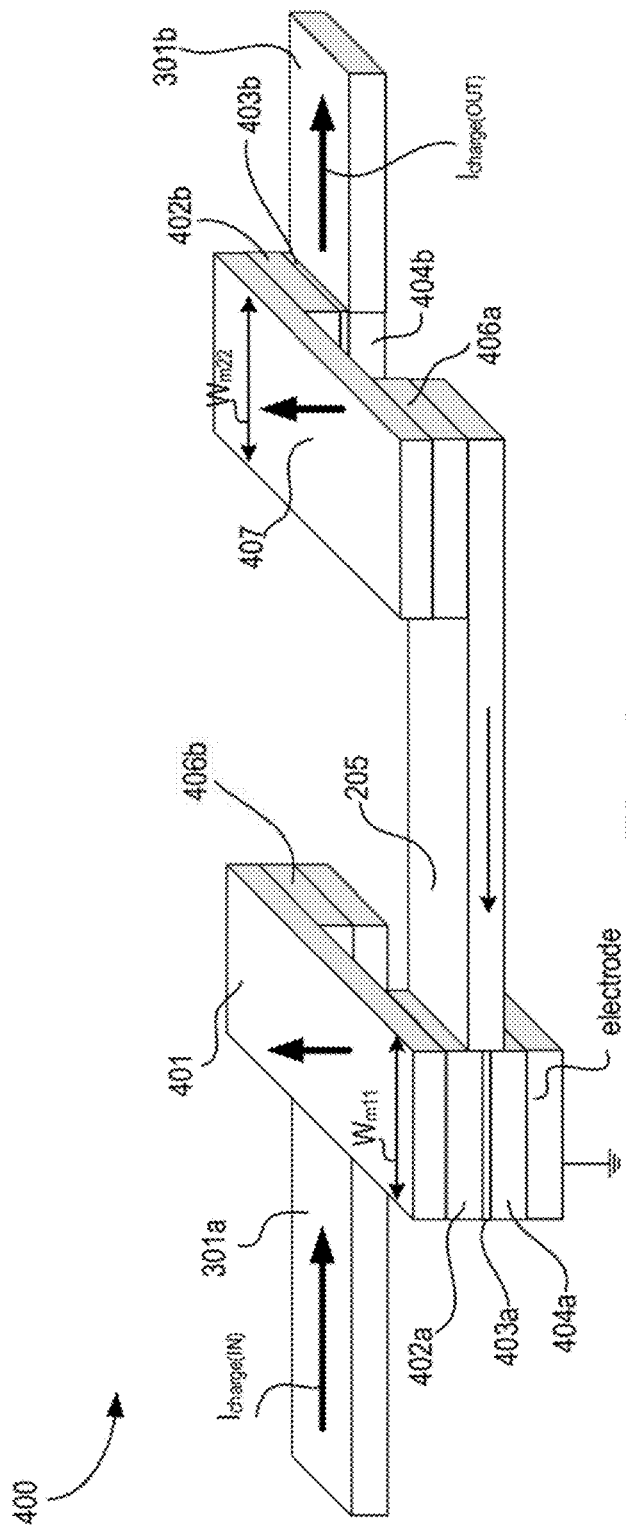
FIG. 4 illustrates a perpendicular magnetoelectric SOL with relaxed aspect ratios, according to some embodiments of the disclosure.

FIG. 4 illustrates perpendicular magnetoelectric SOL 400 with relaxed aspect ratios, according to some embodiments of the disclosure. In FM (ferromagnet) 101, the value of anisotropy and thus stability of its magnetization configuration was dictated by its shape (e.g., aspect ratios). In some embodiments, paramagnets 401 and 407 do not need to possess a certain value of anisotropy. It is pointed out that those elements of FIG. 4 having the same reference numbers (or names) as the elements of any other figure can operate or function in any manner similar to that described, but are not limited to such. Compared to SOL 300, here SOL 400 has wider first and second magnets 401 and 407, respectively. In this example, the width $W_{m11}$ of first magnet 401 is larger than the width $W_{m1}$ of first magnet 201, and the width $W_{m22}$ of second magnet 407 is larger than the width $W_{m2}$ of second magnet 207. One reason for having relaxed aspect ratios for SOL 400 is that the magnetization of magnets with PMA may not depend on the shape of the magnet (e.g., aspect ratio may play little to no role in the magnetization direction of paramagnets as opposed to ferromagnets). This allows SOL logic of various embodiments to have arbitrary shape, which provides more design flexibility compared to SOL logic using FMs with in-plane magnetizations.

Figure 5:
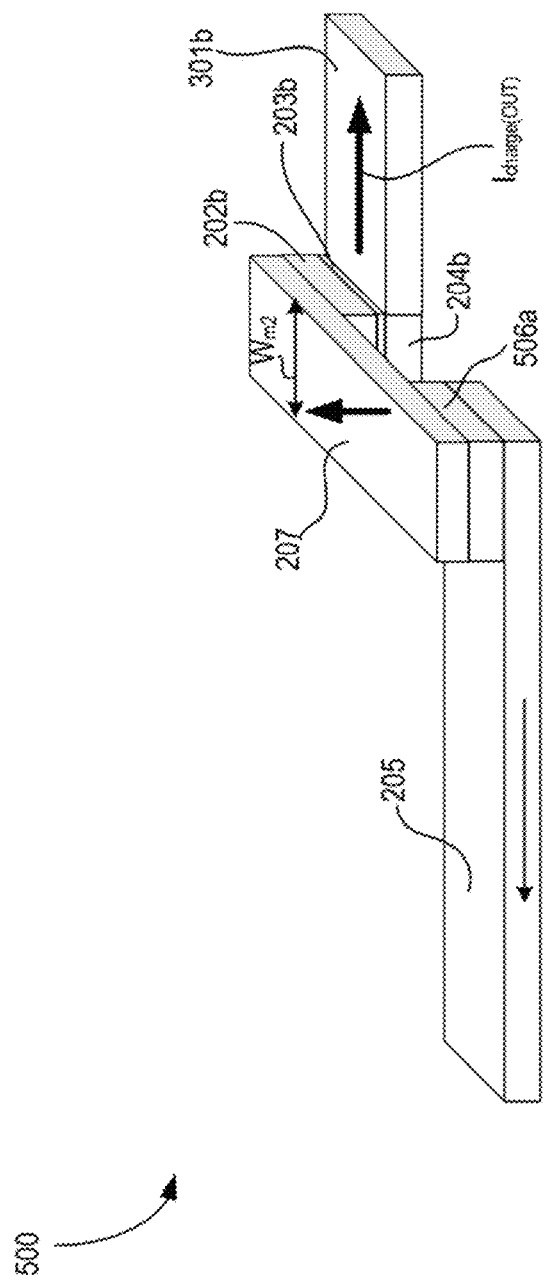
FIG. 5 illustrates a portion of a perpendicular magnetoelectric SOL with canted Bismuth Ferrite (BFO) (e.g., $R_{BFO-100}$ pseudo cubes) for perpendicular magnetic exchange coupling, according to some embodiments of the disclosure.

FIG. 5 illustrates portion 500 of a perpendicular magnetoelectric SOL with canted Bismuth Ferrite (BFO), for perpendicular magnetic exchange coupling, according to some embodiments of the disclosure. It is pointed out that those elements of FIG. 5 having the same reference numbers (or names) as the elements of any other figure can operate or function in any manner similar to that described, but are not limited to such. In some embodiments, ME layer 206a is replaced with ME layer 506a which comprises a canted BFO (p-100) which is a pseudo cube or substrate as a source of perpendicular magnetic exchange coupling. The same canted BFO can be used as ME layer 206b in accordance with some embodiments. BFO exhibits a distorted perovskite structure with cube-like rhombohedral symmetry. BFO materials exhibits coexisting ferroelectric and anti-ferromagnetic orderings at room temperature due to a residual moment from a canted spin structure. An example of canted BFO is $R_{BFO-100}$ pseudo cube which is illustrated with reference to FIGS. 6A-B. BFO has exchange bias components both in-plane and out-of-plane directions. Conversely, $Cr_2O_3$ has the out-of-plane component.

Figure 6A:
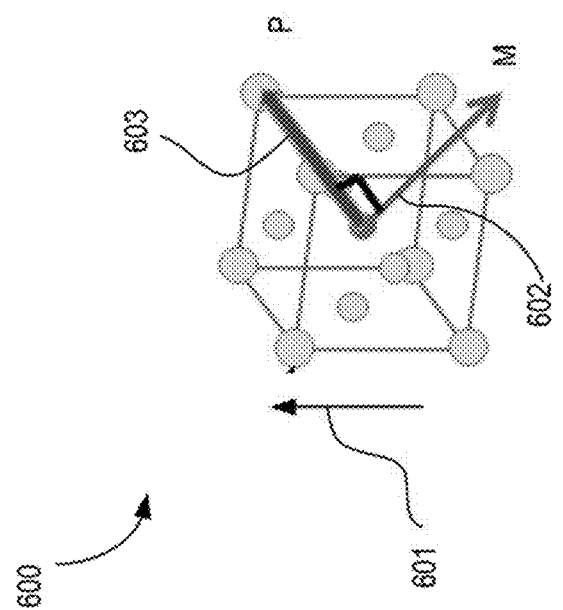
FIGS. 6A-B illustrates $R_{BFO-100}$ pseudo cubes for two different electric field applications, in accordance with some embodiments of the disclosure.
Figure 6B:
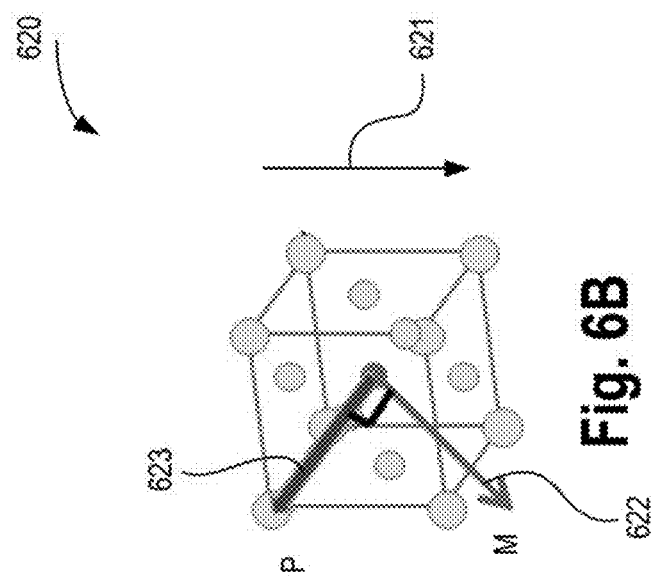

FIGS. 6A-B illustrate $R_{BFO-100}$ pseudo cubes 600 and 620 for two different electric field applications, respectively, in accordance with some embodiments of the disclosure. It is pointed out that those elements of FIGS. 6A-B having the same reference numbers (or names) as the elements of any other figure can operate or function in any manner similar to that described, but are not limited to such. $R_{BFO-100}$ pseudo cube 600 illustrates the canted magnetization 603 'M' and ferroelectric polarization 602 'P' upon application of electric field 601. $R_{BFO-100}$ pseudo cube 620 illustrates the canted magnetization 623 'M' and ferroelectric polarization 622 'P' upon application of electric field 621. The cubic lattice of BFO is responsible for ME effect.

Figure 7A:
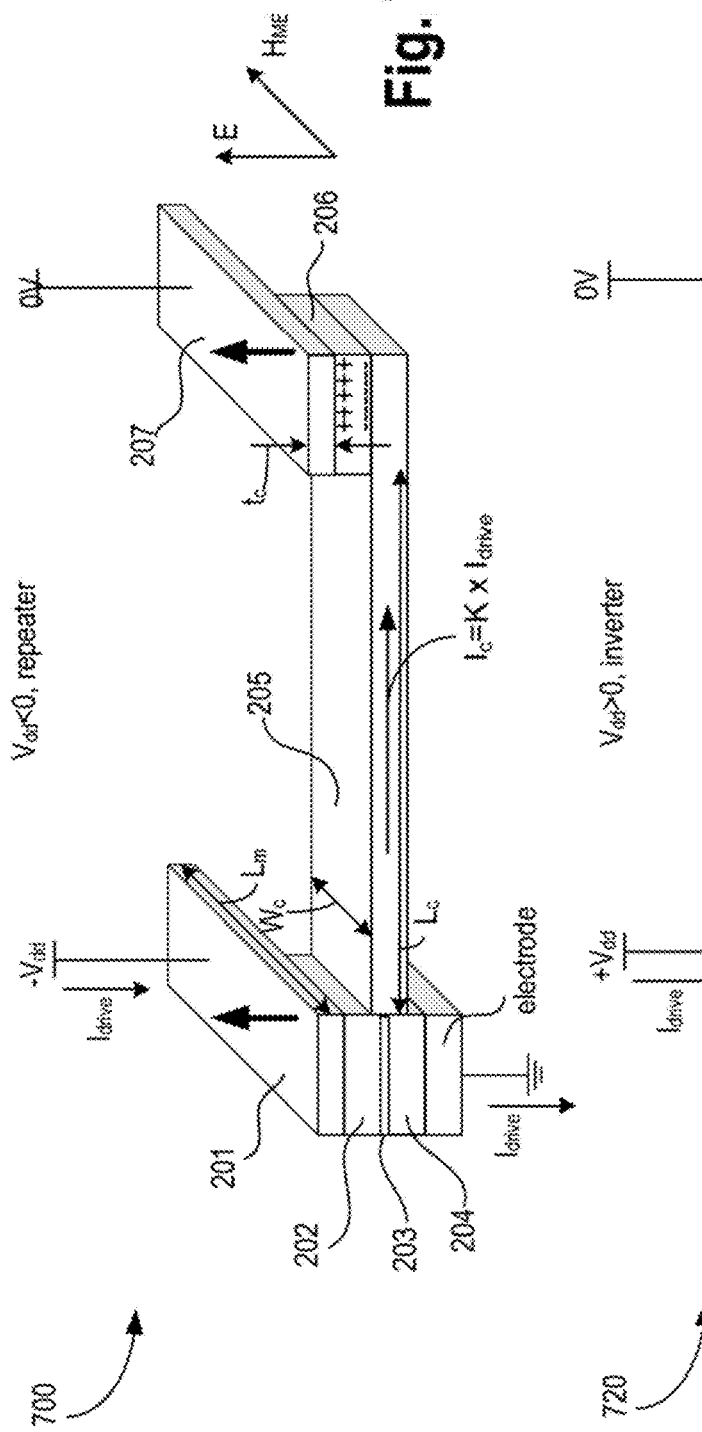
FIG. 7A illustrates a perpendicular magnetoelectric SOL operable as a repeater, according to some embodiments.

FIG. 7A illustrates perpendicular magnetoelectric SOL 700 operable as a repeater (or buffer), according to some embodiments. It is pointed out that those elements of FIG. 7A having the same reference numbers (or names) as the elements of any other figure can operate or function in any manner similar to that described, but are not limited to such. In some embodiments, SOL 700 is configured as a repeater. In some embodiments, to configure the SOL as a repeater, a portion of the stack of the layers (e.g., layer 204) is coupled to ground, first magnet 201 (input magnet) is coupled to a negative supply (e.g., $-V_{dd}$), and second magnet 207 (output magnet) is coupled to ground (e.g., 0V). For $-V_{dd}$ supply voltage applied to the input magnet, a spin current polarized in the same direction as the nanomagnets is injected into the high SOC region (i.e., stack having layers 202, 203, and 204). The inverse Rashba-Bychkov effects (or inverse SOC effects of stack having layers 202, 203, and 204) produce a charge current proportional to the injected spin current. The injected charge current $I_c$ charges magnetoelectric stack (e.g., ME layer 206) producing a large effect magnetic field on output magnet 207. When SOL device 700 operates as a repeater, magnetization of input magnet 201 is same as the magnetization of output magnet 207.

Figure 7B:
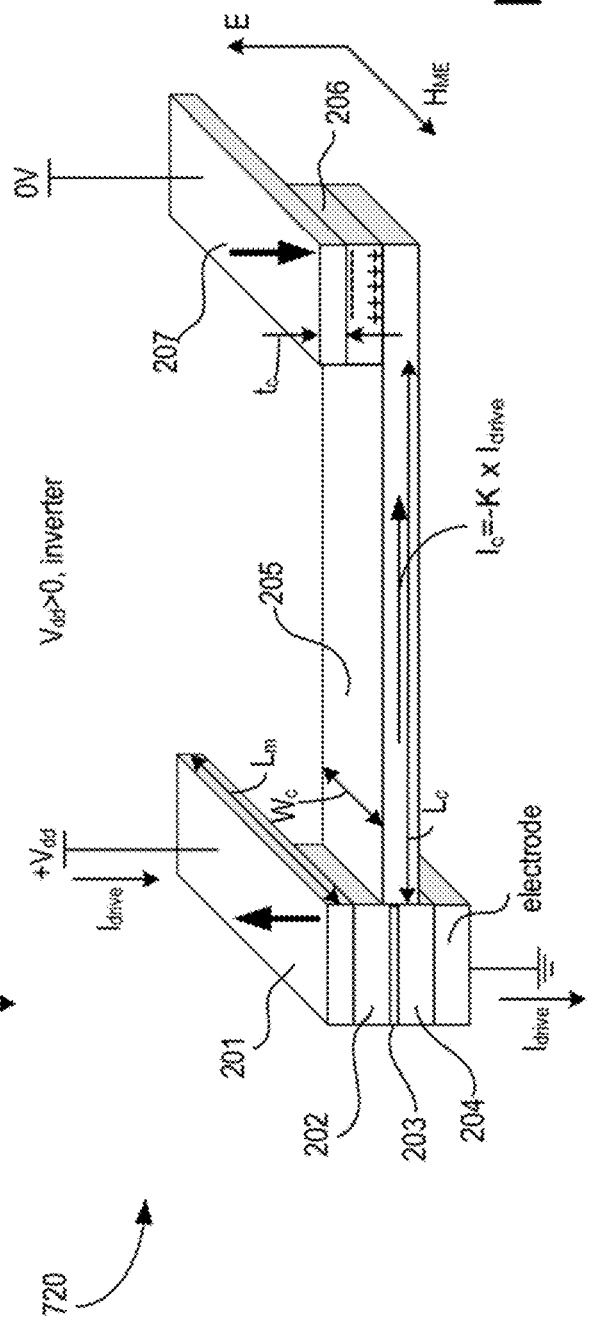
FIG. 7B illustrates a perpendicular magnetoelectric SOL operable as an inverter, according to some embodiments.

FIG. 7B illustrates perpendicular magnetoelectric SOL 720 operable as an inverter, according to some embodiments. It is pointed out that those elements of FIG. 7B having the same reference numbers (or names) as the elements of any other figure can operate or function in any manner similar to that described, but are not limited to such. In some embodiments, a portion of the stack of the layers (e.g., layer 204) is coupled to ground, first magnet 201 (input magnet) is coupled to a positive supply (e.g., +Vdd), and second magnet 207 (output magnet) is coupled to ground (e.g., 0V). The logic inverter operation of SOL device 720 works by injection of a spin current from input magnet 201 with a +Vdd supply voltage. The inverse Rashba-Bychkov effects (or SOC effects of stack having layers 202, 203, and 204) produces charge current $I_c$ which is injected into conductor 205. The injected charge current $I_c$ charges magnetoelectric stack including layer 206 with opposite polarity, producing a large effective magnetic field on the detector free layer 207. When SOL device 720 operates as an inverter, magnetization of input magnet 201 is opposite to the magnetization of output magnet 207.

SOL devices of various embodiments provide logic cascadability and unidirectional signal propagation (e.g., input-output isolation). The unidirectional nature of logic is ensured due to large difference in impedance for injection path versus detection path. The injector is essentially a metallic spin valve with spin to charge transduction with RA (resistance area) products of approximately 10 mOhm·micron$^2$. The detection path is a low leakage capacitance with RA products much larger than 1 MOhm·micron² in series with the resistance of the FM capacitor plate with estimated resistance greater than 500 Ohms.

Figure 8:
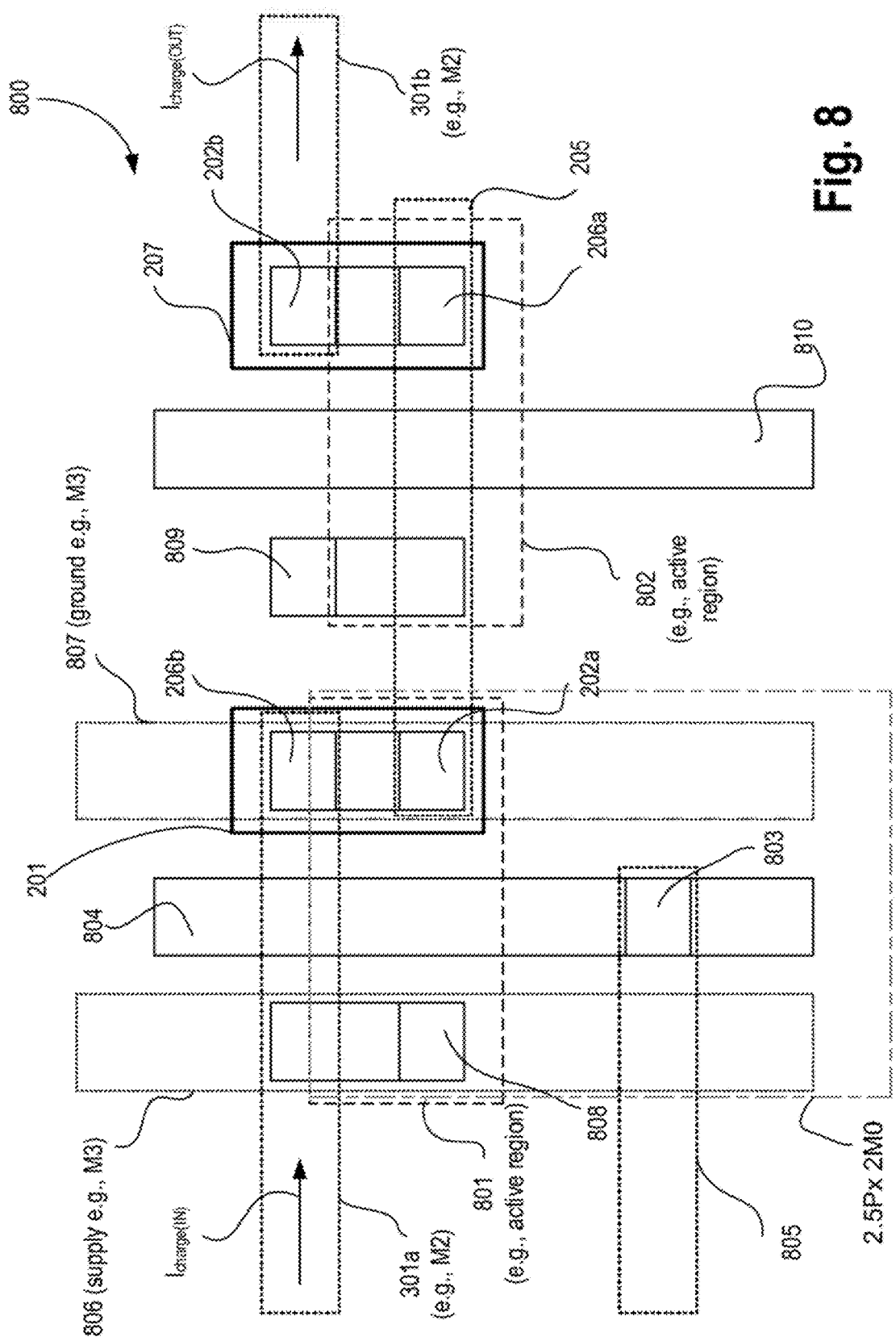
FIG. 8 illustrates a top view of a layout of the perpendicular magnetoelectric SOL, according to some embodiments.

FIG. 8 illustrates a top view of a layout 800 of the perpendicular magnetoelectric SOL, according to some embodiments. It is pointed out that those elements of FIG. 8 having the same reference numbers (or names) as the elements of any other figure can operate or function in any manner similar to that described, but are not limited to such. An integration scheme for SOL devices with CMOS drivers for power supply and clocking is shown in the top view. Here, transistor MP1 is formed in the active region 801, and power supply is provided via metal layer 3 (M3) indicated as 806. The gate terminal 804 of transistor MP1 is coupled to a supply interconnect 805 through via or contact 803. In some embodiments, M3 layer 807 is coupled to ground which provides ground supply to layer 204. In some embodiments, another transistor can be formed in active region 802 with gate terminal 810. Here, 808 and 809 are contact vias to the power supply line. The density of integration of the devices exceeds that of CMOS since an inverter operation can be achieved within 2.5 P×2M0. In some embodiments, since the power transistor MP1 can be shared among all the devices at the same clock phases, vertical integration can also be used to increase the logic density as described with reference to FIG. 9, in accordance with some embodiments.

Figure 9:
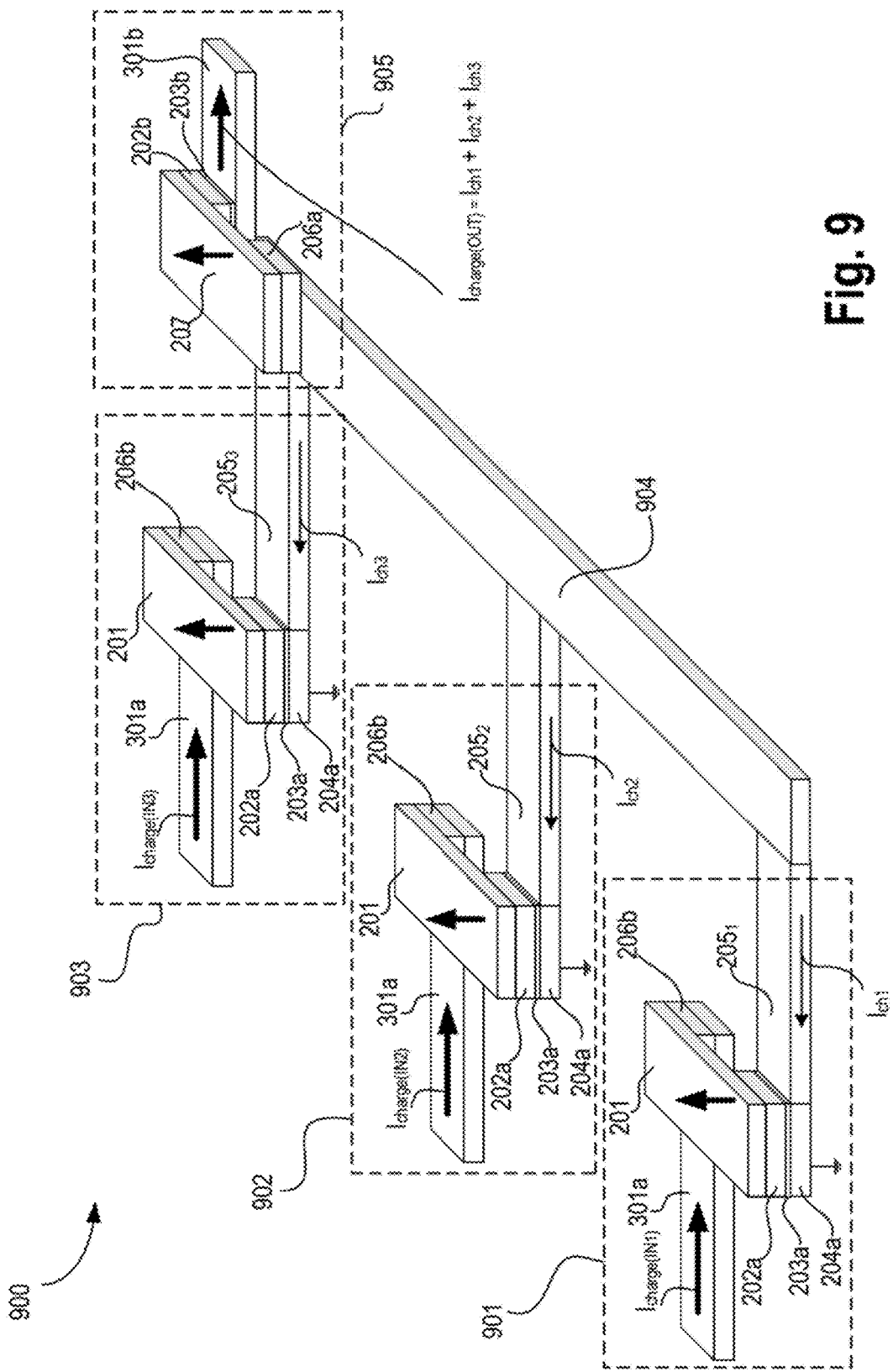
FIG. 9 illustrates a majority gate using perpendicular magnetoelectric SOL, according to some embodiments.

FIG. 9 illustrates majority gate 900 using perpendicular magnetoelectric SOL, according to some embodiments. It is pointed out that those elements of FIG. 9 having the same reference numbers (or names) as the elements of any other figure can operate or function in any manner similar to that described, but are not limited to such. It is pointed out that those elements of FIG. 9 having the same reference numbers (or names) as the elements of any other figure can operate or function in any manner similar to that described, but are not limited to such. A charge mediated majority gate is proposed using the spin orbit coupling and magnetoelectric switching. A charge mediated majority gate is shown in FIG. 9. Majority gate 900 comprises at least three input stages 901, 902, and 903 with their respective conductors $205_1$, $205_2$, and $205_3$ coupled to summing interconnect 904. In some embodiments, summing interconnect 904 (e.g., made of the same materials as interconnect 205). In some embodiments, summing interconnect 904 is coupled to the output stage 905 which includes the second magnet 207. The three input stages 901, 902, and 903 share a common power/clock region therefore the power/clock gating transistor can be shared among the three inputs of the majority gate, in accordance with some embodiments. The input stages 901, 902, and 903 can also be stacked vertically to improve the logic density, in accordance with some embodiments. The charge current at the output ($I_{charge(OUT)}$) is the sum of currents $I_{ch1}$, $I_{ch2}$, and $I_{ch3}$.

Figure 10:
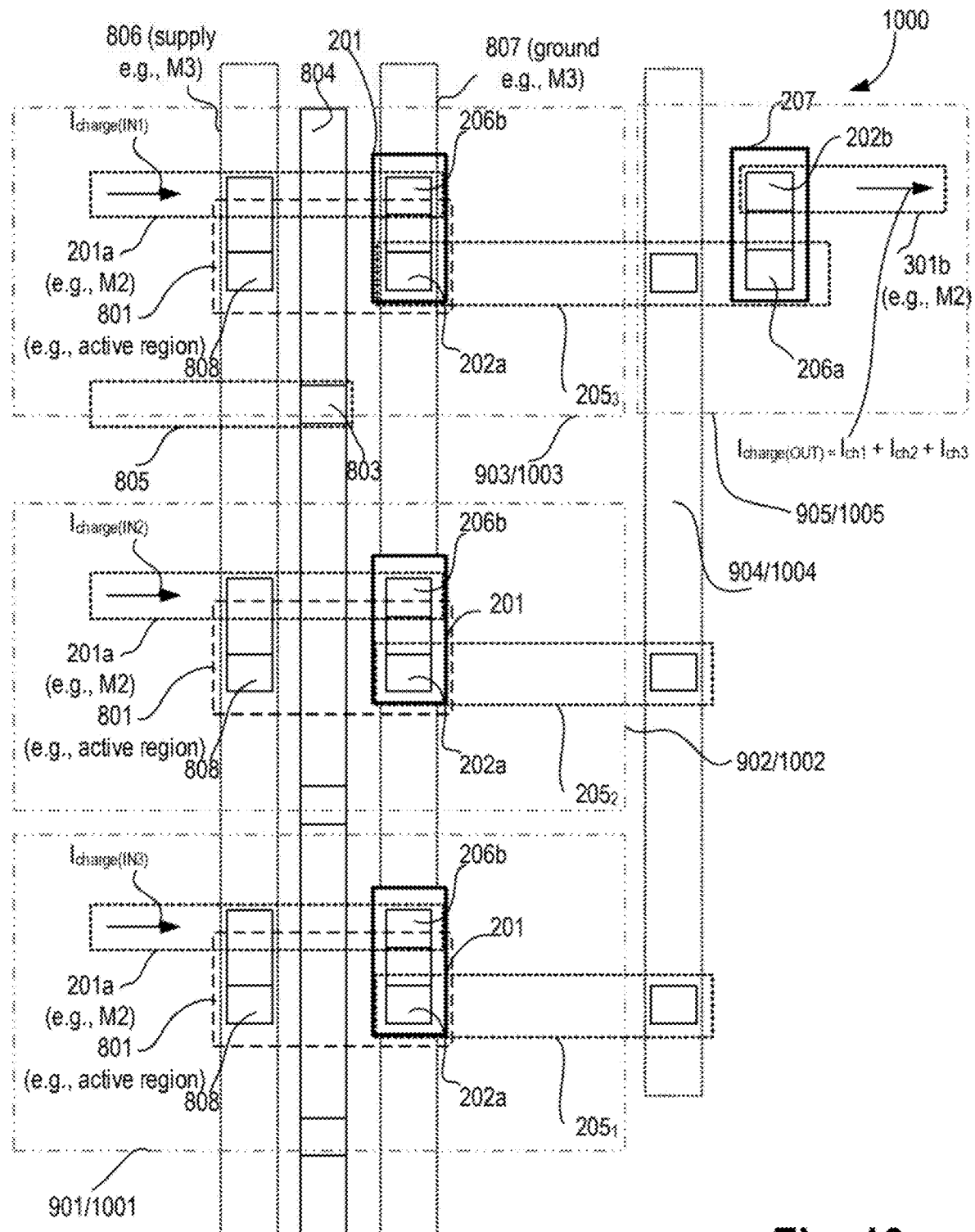
FIG. 10 illustrates a top view of a layout of the majority gate, according to some embodiments.

FIG. 10 illustrates a top view of layout 1000 of the majority gate, according to some embodiments. It is pointed out that those elements of FIG. 10 having the same reference numbers (or names) as the elements of any other figure can operate or function in any manner similar to that described, but are not limited to such. Majority gate 1000 comprises at least three input stages 901/1001, 902/1002, and 903/1003 with their respective conductors $205_1$, $205_2$, and $205_3$ coupled to summing interconnect 904/1004. Summing interconnect 904/1004 is then coupled to the output stage 905/1005.

Figure 11:
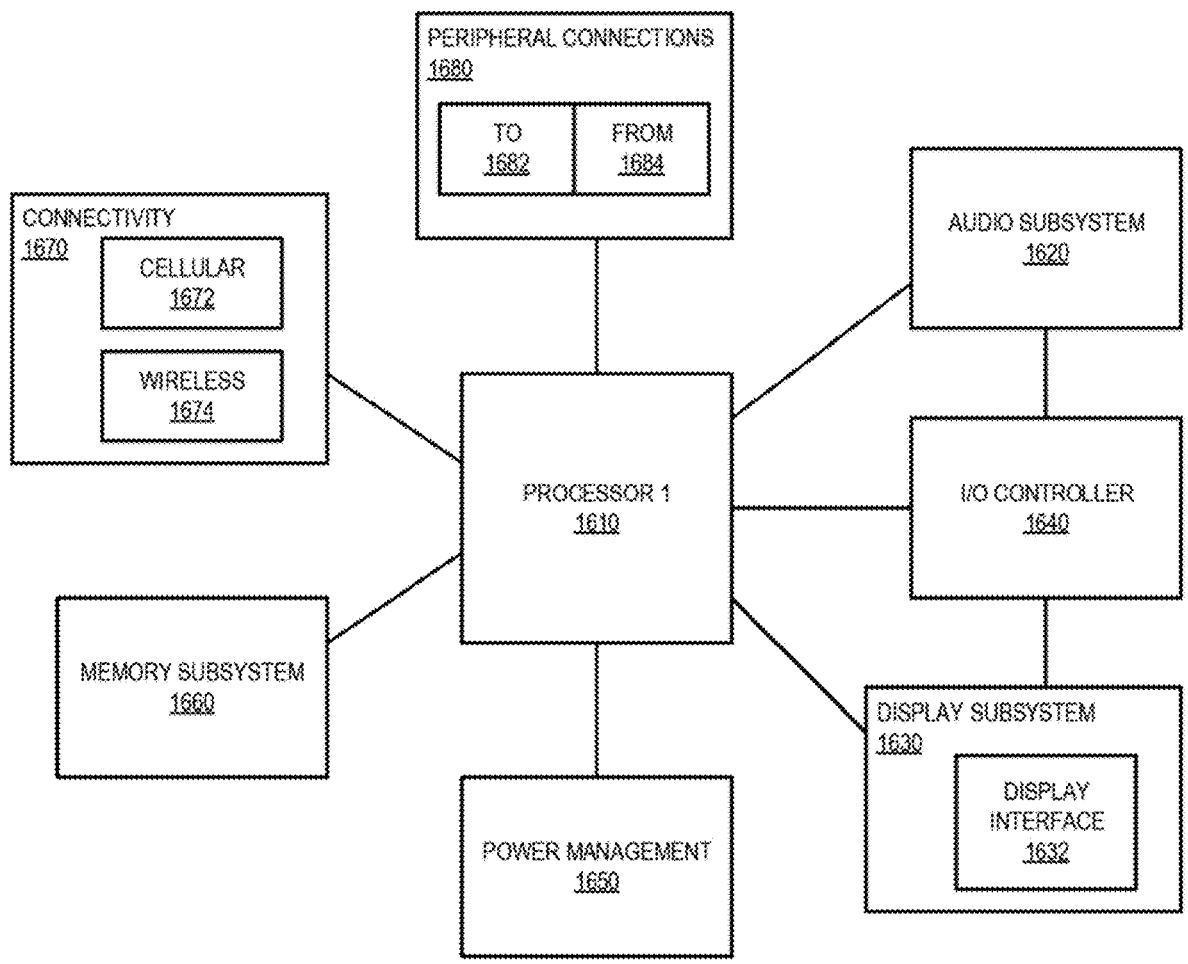
FIG. 11 illustrates a smart device or a computer system or a SoC (System-on-Chip) with perpendicular magnetoelectric SOL, according to some embodiments.

FIG. 11 illustrates a smart device or a computer system or a SoC (System-on-Chip) 1600 with perpendicular magnetoelectric SOL, according to some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with Perpendicular Magnetoelectric Spin Orbit Logic, according to some embodiments discussed. Other blocks of the computing device 1600 may also include a Perpendicular Magnetoelectric Spin Orbit Logic, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

For example, according to example 1, an apparatus is provided which comprises: a first magnet with perpendicular magnetic anisotropy (PMA); a stack of layers, a portion of which is adjacent to the first magnet, wherein the stack of layers is to provide an inverse Rashba-Bychkov effect; a second magnet with PMA; a magnetoelectric layer adjacent to the second magnet; and a conductor coupled to at least a portion of the stack of layers and the magnetoelectric layer.

Example 2 includes the features of example 1, and wherein the magnetoelectric layer comprises magnetoelectric perovskites having output out-of-plane remnant magnetization, according to some embodiments.

Example 3 includes features of example 1, and wherein the magnetoelectric perovskites comprise a material which includes one of: BFO, La—BFO, or Ce—BFO, according to some embodiments.

Example 4 includes features of examples 1 and 2, and wherein the magnetoelectric layer comprises magnetoelectric oxides having out-of-plane magnetism without ferroelectricity, according to some embodiments of the disclosure.

Example 5 includes features of clause 4, and wherein the magnetoelectric layer comprises a material which includes one of: $Cr_2O_3$ or $B-Cr_2O_3$, according to some embodiments of the disclosure.

Example 6 includes features of any one of examples 1 through 5, and wherein the stack of materials comprise two-dimensional materials (2D) with spin orbit interaction.

Example 7 includes features of example 6, and wherein the 2D materials include one or more of: Mo, S, W, Se, Graphene, $MoS_2$, $WSe_2$, $WS_2$, or MoSe, according to some embodiments of the disclosure.

Example 8 includes features of example 7, and wherein the 2D materials include an absorbent which includes one or more of: Cu, Ag, Pt, Bi, Fr, or H absorbents, according to some embodiments.

Example 9 includes features according to any one of examples 1 through 8, wherein the first and second magnets are magnets comprise dopants which include one or more of: W, O, Ce, Al, Li, Mg, Na, $Cr_2O_3$, CoO, Dy, $Dy_2O$, Er. $Er_2O_3$, Eu, $Eu_2O_3$, Gd, $Gd_2O_3$, FeO, $Fe_2O_3$, Nd, $Nd_2O_3$, K, $KO_2$, Pr, Sm, $Sm_2O_3$, Tb, $Tb_2O_3$, Tm, $Tm_2O_3$, V, or $V_2O_3$, according to some embodiments.

Example 10 includes features according to any of the examples 1 through 8, wherein the first and second magnets comprise one or a combination of materials which include one or more of: a Heusler alloy, Co, Fe, Ni, Gd, B, Ge, Ga, permalloy, or Yttrium Iron Garnet (YIG), according to some embodiments.

Example 11 includes features of example 10, and wherein the Heusler alloy comprises one or more of: Cu, Mn, Al, In, Sn, Ni, Sb, Ga, Co, Ge, Pd, Fe, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga and Ge, according to some embodiments.

Example 12 includes features of any one of examples 1 through 8, and wherein the first and second magnets are formed of a stack of materials, wherein the materials for the stack include one or more of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure, according to some embodiments.

Example 13 includes features of example 1, and wherein the first and second magnets are formed of a single layer of one or more materials, according to some embodiments.

Example, 14 includes features of example, 13, and wherein the single layer comprises Mn and Ga, according to some embodiments.

Example, 15 includes features of example 1, and wherein the conductor is formed of a material which includes one or more of: Cu, Ag, Al, or Au, according to some embodiments.

Example 16 includes features of example 1, and comprises a layer sandwiched between the stack of layers and the first magnet, according to some embodiments.

Example, 17 includes features of example, 16, wherein the layer comprises Ag, according to some embodiments.

Example 18 includes features of example 17, and comprises a transistor coupled to the first paramagnet, according to some embodiments.

Example 19 includes features of example, 18, and wherein a portion of the stack of the layers is coupled to ground, wherein the first paramagnet is coupled to a negative supply, and wherein the second paramagnet is coupled to ground, according to some embodiments.

Example 20 includes features of example, 1, and wherein a portion of the stack of the layers is coupled to ground, wherein the first paramagnet is coupled to a positive supply, and wherein the second paramagnet is coupled to ground, according to some embodiments.

Example 21 includes features of example, 1, and wherein the stack of layers comprise materials $ROCh_2$, where R includes one or more of: La, Ce, Pr, Nd, Sr, Sc, Ga, Al, or In, and where Ch is a chalcogenide which includes one or more of: S, Se, or Te, according to some embodiments.

In another set of examples (herein example, 22) a system is provided which comprises: a memory; a processor coupled to the memory, the processor including an apparatus according to any one of apparatus examples 1 to 21; and a wireless interface to allow the processor to communicate with another device, according to some embodiments.

In another set of examples (herein example 23), a method is provided which comprises: forming a first magnet with perpendicular magnetic anisotropy (PMA); fabricating a stack of layers, a portion of which is adjacent to the first magnet, wherein the stack of layers is to provide an inverse Rashba-Bychkov effect; forming a second magnet with PMA; forming a magnetoelectric layer adjacent to the second magnet; and coupling a conductor to at least a portion of the stack of layers and the magnetoelectric layer, according to some embodiments.

Example 24 is provided which includes features of example 23 and comprises fabricating a transistor and coupling it to the first magnet, according to some embodiments.

Example, 25 is provided which includes features of example 23 and comprises coupling a portion of the stack of the layers to ground; coupling the first magnet to a negative supply; and coupling the second magnet to ground, according to some embodiments.

Example 26 is provided which includes features of example 24 and comprises: coupling a portion of the stack of the layers to ground; coupling the first magnet to a positive supply; and coupling the second magnet to ground, according to some embodiments.

Example 27 is provided which comprises features of example 23, and wherein the magnetoelectric layer comprises magnetoelectric perovskites having output out-of-plane remnant magnetization, according to some embodiments.

Example 28 is provided which comprises features of example 27, and wherein the magnetoelectric perovskites comprise a material which includes one of: BFO, La—BFO, or Ce—BFO, according to some embodiments.

Example 29 is provided which includes features of example 27, and wherein the magnetoelectric layer comprises magnetoelectric oxides having out-of-plane magnetism without ferroelectricity, according to some embodiments.

Example 30 is provided which comprises features of example 29, and wherein the magnetoelectric layer comprises a material which includes one of: $Cr_2O_3$ or B—$Cr_2O_3$, according to some embodiments.

Example 31 is provided which comprises features of example 23, and wherein the stack of materials comprise two-dimensional materials (2D) with spin orbit interaction.

Example 32 is provided which comprises features of example 31, and wherein the 2D materials include one or more of: Mo, S, W, Se, Graphene, $MoS_2$, $WSe_2$, $WS_2$, or $MoSe_2$, according to some embodiments.

Example 33 is provided which comprises features of example 31, and wherein the 2D materials include an absorbent which includes one or more of: Cu, Ag, Pt, Bi, Fr, or H absorbents, according to some embodiments.

Example 34 is provided which comprises features of example 23, and wherein the first and second magnets are magnets comprise dopants which include one or more of: W, O, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, K, $KO_2$, Pr, Sm, $Sm_2O_3$, Tb, $Tb_2O_3$, Tm, $Tm_2O_3$, V, or $V_2O_3$, according to some embodiments.

Example 35 is provided which comprises features of example 23, and wherein the first and second magnets comprise one or a combination of materials which include one or more of: a Heusler alloy, Co, Fe, Ni, Gd, B, Ge, Ga, permalloy, or Yttrium Iron Garnet (YIG), according to some embodiments.

Example 36 is provided which comprises features of example 35, and wherein the Heusler alloy comprises one or more of: Cu, Mn, Al, In, Sn, Ni, Sb, Ga, Co, Ge, Pd, Fe, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga and Ge, according to some embodiments.

Example 37 is provided which comprises features of example 36, and wherein the first and second magnets are formed of a stack of materials, wherein the materials for the stack include one or more of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure, according to some embodiments. Example 38 is provided which comprises features of example 23, and wherein the first and second magnets are formed of a single layer of one or more materials. Example 39 is provided which comprises features of example 38, and wherein the single layer comprises Mn and Ga, according to some embodiments. Example 40 is provided which comprises features of example 23, and wherein the conductor is formed of a material which includes one or more of: Cu, Ag, Al, or Au, according to some embodiments. Example 41 is provided which comprises features of example 23, and comprises forming a layer sandwiched between the stack of layers and the first magnet, according to some embodiments. Example 42 is provided which comprises features of example 41, and wherein the layer comprises Ag, according to some embodiments. Example 43 is provided which comprises features of example 23, and comprises forming a transistor which is coupled to the first paramagnet. Example 44 is provided which comprises features of example 23, and wherein the stack of layers comprise materials $ROCh_2$, where R includes one or more of: La, Ce, Pr, Nd, Sr, Sc, Ga, Al, or In, and where Ch is a chalcogenide which includes one or more of: S, Se, or Te, according to some embodiments.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first magnet with perpendicular magnetic anisotropy (PMA);
    a stack of layers, a portion of which is adjacent to the first magnet, wherein the stack of layers is to provide an inverse Rashba-Bychkov effect;
    a second magnet with PMA;
    a layer comprising magnetoelectric material, wherein the layer is adjacent to the second magnet; and
    a conductor coupled to at least a portion of the stack of layers and the layer.

2. The apparatus of claim 1, wherein the layer comprises magnetoelectric perovskites having output out-of-plane remnant magnetization.

3. The apparatus of claim 2, wherein the magnetoelectric perovskites comprise a material which includes one or more of: B, Fe, La, or Ce.

4. The apparatus of claim 2, wherein the layer comprises magnetoelectric oxides having out-of-plane magnetism without ferroelectricity, and wherein the layer comprises a material which includes one or more of: Cr or B.

5. The apparatus of claim 1, wherein the stack of materials comprise two-dimensional materials (2D materials) with spin orbit interaction, wherein the 2D materials include one or more of: Mo, S, W, Se, Graphene, and wherein the 2D materials include an absorbent which includes one or more of: Cu, Ag, Pt, Bi, Fr, or H absorbents.

6. The apparatus of claim 1, wherein the first and second magnets comprise dopants which include one or more of: W, O, Ce, Al, Li, Mg, Na, Cr, Co, Dy, Er, Eu, Gd, Fe, Nd, K, Pr, Sm, Tb, Tm, or V.

7. The apparatus of claim 1, wherein the first and second magnets comprise one or a combination of materials which include one or more of: a Heusler alloy, Co, Fe, Ni, Gd, B, Ge, Ga, permalloy, or Yttrium Iron Garnet (YIG).

8. The apparatus of claim 7, wherein the Heusler alloy comprises one or more of: Cu, Mn, Al, In, Sn, Ni, Sb, Ga, Co, Ge, Pd, Fe, V, or Ru.

9. The apparatus of claim 1, wherein the first and second magnets comprise a stack of materials, wherein the materials for the stack include one or more of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure.

10. The apparatus of claim 1, wherein the first and second magnets comprise a single layer of one or more material, and wherein the single layer comprises Mn and Ga.

11. The apparatus of claim 1, wherein the conductor comprises a material which includes one or more of: Cu, Ag, Al, or Au.

12. The apparatus of claim 1, wherein the layer is a first layer, wherein the apparatus comprises a second layer between the stack of layers and the first magnet, and wherein the second layer comprises Ag.

13. The apparatus of claim 1 comprises a transistor coupled to the first magnet.

14. The apparatus of claim 1, wherein a portion of the stack of the layers is coupled to ground, wherein the first magnet is coupled to a negative supply, and wherein the second magnet is coupled to ground.

15. The apparatus of claim 1, wherein a portion of the stack of the layers is coupled to ground, wherein the first magnet is coupled to a positive supply, and wherein the second magnet is coupled to ground.

16. The apparatus of claim 1, wherein the stack of layers comprise $ROCh_2$, where R includes one or more of: La, Ce, Pr, Nd, Sr, Sc, Ga, Al, or In, and where Ch is a chalcogenide which includes one or more of: S, Se, or Te.

17. A system comprising: a memory; a processor coupled to the memory, the processor including an apparatus which comprises:
a first magnet with perpendicular magnetic anisotropy (PMA);
a stack of layers, a portion of which is adjacent to the first magnet, wherein the stack of layers is to provide an inverse Rashba-Bychkov effect;
a second magnet with PMA;
a layer with magnetoelectric material, wherein the layer is adjacent to the second magnet;
a conductor coupled to at least a portion of the stack of layers and the layer; and
a wireless interface to allow the processor to communicate with another device.

18. The system of claim 17, wherein the layer comprises magnetoelectric perovskites having output out-of-plane remnant magnetization, and wherein the magnetoelectric perovskites comprise a material which includes one or more of: B, Fe, La, or Ce.

19. The system of claim 17, wherein the layer comprises magnetoelectric oxides having out-of-plane magnetism without ferroelectricity, and wherein the layer comprises a material which includes one or more of: Cr or B.

20. A method comprising:
forming a first magnet with perpendicular magnetic anisotropy (PMA);
fabricating a stack of layers, a portion of which is adjacent to the first magnet, wherein the stack of layers is to provide an inverse Rashba-Bychkov effect;
forming a second magnet with PMA;
forming a layer with magnetoelectric material, wherein the layer is adjacent to the second magnet; and
coupling a conductor to at least a portion of the stack of layers and the layer.

21. The method of claim 20 comprises:
fabricating a transistor and coupling it to the first magnet;
coupling a portion of the stack of the layers to a ground;
coupling the first magnet to a negative supply; and
coupling the second magnet to the ground.

22. The method of claim 20 comprises:
coupling a portion of the stack of the layers to a ground;
coupling the first magnet to a positive supply; and
coupling the second magnet to the ground.

* * * * *